(12) United States Patent
Drake et al.

(10) Patent No.: US 9,878,938 B2
(45) Date of Patent: *Jan. 30, 2018

(54) ANTIMONY-FREE GLASS, ANTIMONY-FREE FRIT AND A GLASS PACKAGE THAT IS HERMETICALLY SEALED WITH THE FRIT

(71) Applicant: Corning Incorporated, Corning, NY (US)

(72) Inventors: Melinda Ann Drake, Corning, NY (US); Robert Michael Morena, Lindley, NY (US)

(73) Assignee: Corning Incorporated, Corning, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/245,578

(22) Filed: Aug. 24, 2016

(65) Prior Publication Data

US 2016/0362329 A1    Dec. 15, 2016

Related U.S. Application Data

(63) Continuation of application No. 14/458,738, filed on Aug. 13, 2014, now Pat. No. 9,573,840.

(Continued)

(51) Int. Cl.
*B32B 17/06* (2006.01)
*C03C 3/21* (2006.01)
(Continued)

(52) U.S. Cl.
CPC ............. *C03C 3/21* (2013.01); *B32B 17/06* (2013.01); *C03C 3/16* (2013.01); *C03C 8/08* (2013.01);
(Continued)

(58) Field of Classification Search
USPC .......................... 428/426, 428, 432
See application file for complete search history.

(56) References Cited

U.S. PATENT DOCUMENTS 4,342,943 A * 8/1982 Weaver ............... C03C 8/24
 252/506
5,066,621 A * 11/1991 Akhtar ............... C03C 3/12
 106/1.14

(Continued)

FOREIGN PATENT DOCUMENTS

CN  101633560 A  1/2010
JP  2010052990 A  3/2010
(Continued)

OTHER PUBLICATIONS

Kashif et al.; "Crystallization process and electrical conductivity in vanadium borophosphate glass containing iron"; Materials Science and Engineering, B10 (1991); pp. 1-5.
(Continued)

*Primary Examiner* — Lauren R Colgan
(74) *Attorney, Agent, or Firm* — Kevin M. Able

(57) ABSTRACT

An antimony-free glass suitable for use in a frit for producing a hermetically sealed glass package is described. The hermetically sealed glass package, such as an OLED display device, is manufactured by providing a first glass substrate plate and a second glass substrate plate and depositing the antimony-free frit onto the first substrate plate. OLEDs may be deposited on the second glass substrate plate. An irradiation source (e.g., laser, infrared light) is then used to heat the frit which melts and forms a hermetic seal that connects the first glass substrate plate to the second glass substrate plate and also protects the OLEDs. The antimony-free glass has excellent aqueous durability, good flow, low glass transition temperature and low coefficient of thermal expansion.

9 Claims, 3 Drawing Sheets

Related U.S. Application Data

(60) Provisional application No. 61/870,419, filed on Aug. 27, 2013.

(51) Int. Cl.
*C03C 8/08* (2006.01)
*C03C 8/14* (2006.01)
*H01L 51/52* (2006.01)
*C03C 8/24* (2006.01)
*C03C 3/16* (2006.01)

(52) U.S. Cl.
CPC .............. *C03C 8/14* (2013.01); *C03C 8/24* (2013.01); *H01L 51/5246* (2013.01); *B32B 2315/08* (2013.01); *B32B 2457/206* (2013.01); *C03C 2207/00* (2013.01)

(56) References Cited

U.S. PATENT DOCUMENTS

| | | | |
|---|---|---|---|
| 6,998,776 B2 | 2/2006 | Aitken et al. | |
| 7,407,423 B2 | 8/2008 | Aitken et al. | |
| 7,425,518 B2 | 9/2008 | Yoshida et al. | |
| 7,641,976 B2 | 1/2010 | Lamberson et al. | |
| 8,063,560 B2 | 11/2011 | Aitken et al. | |
| 8,198,203 B2 | 6/2012 | Lamberson et al. | |
| 8,367,573 B2 * | 2/2013 | Naito | C03C 3/062 136/256 |
| 8,823,163 B2 | 9/2014 | Drake et al. | |
| 9,165,719 B2 * | 10/2015 | Logunov | C03C 8/08 |
| 9,290,408 B2 * | 3/2016 | Dennis | C03C 8/04 |
| 9,346,708 B2 * | 5/2016 | Drake | C03C 17/04 |
| 9,573,840 B2 * | 2/2017 | Drake | B32B 17/06 |
| 2004/0207314 A1 * | 10/2004 | Aitken | C03C 3/072 313/504 |
| 2005/0233885 A1 * | 10/2005 | Yoshida | C03C 3/122 501/15 |
| 2005/0248270 A1 * | 11/2005 | Ghosh | H01L 51/5259 313/512 |
| 2008/0124558 A1 | 5/2008 | Boek et al. | |
| 2009/0029623 A1 * | 1/2009 | Son | H01L 51/525 445/25 |
| 2009/0064717 A1 | 3/2009 | Son et al. | |
| 2009/0065049 A1 | 3/2009 | Son et al. | |
| 2009/0069164 A1 * | 3/2009 | Lamberson | C03C 1/026 501/15 |
| 2010/0018934 A1 | 1/2010 | Ferrer et al. | |
| 2010/0180934 A1 * | 7/2010 | Naito | C03C 3/21 136/252 |
| 2011/0015053 A1 | 1/2011 | Hamada et al. | |
| 2011/0091668 A1 * | 4/2011 | Lamberson | C03C 3/21 428/34 |
| 2012/0213951 A1 | 8/2012 | Dennis | |
| 2012/0213954 A1 * | 8/2012 | Dennis | C03C 8/04 428/34 |
| 2014/0061623 A1 * | 3/2014 | Drake | C03C 3/21 257/40 |

FOREIGN PATENT DOCUMENTS

| | | |
|---|---|---|
| JP | 2012106891 A | 6/2012 |
| KR | 2007107589 A | 11/2007 |
| KR | 2009041867 A | 4/2009 |
| WO | 2004095597 A2 | 11/2004 |
| WO | 2010048044 A2 | 4/2010 |
| WO | 2014035954 A2 | 3/2014 |

OTHER PUBLICATIONS

Kashif et al.; "Study of some physical properties of the V2O5-B2O3-P2O5-Fe2O3 glass system"; Physics and Chemistry of Glasses vol. 31, No. 5 (Oct. 1990); pp. 196-198.
Kashif et al.; "Effect of the addition of Fe2O3 and heat treatment duration on the magnetic susceptibility of V2O5-P2O5-B2O3 glass system"; Journal of Materials Science: Materials in Electronics 3 (1992); pp. 144-146.
European Patent Office; International Search Report and Written Opinion of International Patent Application No. PCT/US2014/052259, filed on Aug. 22, 2014; dated Nov. 24, 2014; pp. 1-11.
English Translation of CN201480048004 First Office Action dated Sep. 20, 2017, China Patent Office.
"Apr. 15, 2010, Xiang-Yu Lei et al., "B2O3-V2O5-P2O5-ZnOCrystallization Behavior of Lead-Free Low-Melting Glass"http://www.yoke.net/Pic/DocHistory/LFSSDYXUN1XV0269(1).pdf".
TW103129402 Search Report dated Sep. 29, 2017; 1 page; Taiwan Patent Office.

* cited by examiner (a) (b) (c)

ANTIMONY-FREE GLASS, ANTIMONY-FREE FRIT AND A GLASS PACKAGE THAT IS HERMETICALLY SEALED WITH THE FRIT

PRIORITY

This application is a continuation of U.S. patent application Ser. No. 14/458,738, which issued as U.S. Pat. No. 9,573,840, filed on Aug. 13, 2014, which claims the benefit of priority under 35 U.S.C. § 119 of U.S. Provisional Application Ser. No. 61/870,419 filed on Aug. 27, 2013, the contents of which are relied upon and incorporated herein by reference in their entireties.

TECHNICAL FIELD

The present disclosure relates to an antimony-free glass containing boron in an amount to effectively lower the glass transition temperature of the glass, a frit made therefrom, and a hermetically sealed glass packages sealed with the frit that is suitable to protect electronic devices that are sensitive to the ambient environment. Some examples of such devices are organic emitting light diode (OLED) displays, sensors, photovoltaic and other optical devices. Embodiments disclosed herein are demonstrated using OLED displays as an example.

BACKGROUND

OLEDs have been the subject of a considerable amount of research in recent years because of their use and potential use in a wide variety of electroluminescent devices, and are now reaching commercialization. For instance, a single OLED can be used in a discrete light emitting device or an array of OLEDs can be used in lighting applications or flat-panel display applications (e.g., OLED displays). OLED displays are known as being very bright and having a good color contrast and wide viewing angle. However, OLED displays, and in particular the electrodes and organic layers located therein, are susceptible to degradation resulting from interaction with oxygen and moisture leaking into the OLED display from the ambient environment. It is well known that the life of the OLED display can be significantly increased if the electrodes and organic layers within the OLED display are hermetically sealed from the ambient environment. Unfortunately, in the past it was very difficult to develop a sealing process to hermetically seal the OLED display. Some of the factors that made it difficult to properly seal the OLED display are briefly mentioned below:

The hermetic seal should provide a barrier for oxygen ($10^{-3}$ cc/m²/day) and water ($10^{-6}$ g/m²/day).

The size of the hermetic seal should be minimal (e.g., <2 mm) so it does not have an adverse effect on size of the OLED display.

The temperature generated during the sealing process should not damage the materials (e.g., electrodes and organic layers) within the OLED display. For instance, the first pixels of OLEDs which are located about 1-2 mm from the seal in the OLED display should not be heated to more than 100° C. during the sealing process.

The gases released during the sealing process should not contaminate the materials within the OLED display.

The hermetic seal should enable electrical connections (e.g., thin-film chromium) to enter the OLED display.

One method for sealing the OLED display is to use different types of epoxies, inorganic materials and/or organic materials that form the seal after they are cured, such as by irradiation. For example, some seals use a composite-based approach where alternate layers of inorganic materials and organic materials can be used to seal the OLED display. Although these types of seals usually provide good mechanical strength, they can be very expensive and there are many instances in which they have failed to prevent the diffusion of oxygen and moisture into the OLED display. Another common way for sealing the OLED display is to utilize metal welding or soldering. However, the resulting seal is not durable in a wide range of temperatures because of the substantial differences between the coefficients of thermal expansions (CTEs) of the glass plates and metal in the OLED display.

More recently, glass-based frits have been used to seal glass substrate plates in a glass package that provides excellent hermeticity to the enclosed device. But many of these frits contain toxic elements, such as antimony, which pose environmental hazards. Accordingly, there is a need for a glass-based frit suitable for hermetically sealing glass packages, such as electronic devices (e.g. for display-type applications), having a low coefficient of thermal expansion (CTE) that does not contain antimony.

SUMMARY

The present disclosure describes an antimony-free glass, a frit comprising the antimony-free glass and an hermetically sealed OLED display and method for manufacturing the hermetically sealed OLED display. Basically, an hermetically sealed OLED display is manufactured by providing a first glass substrate plate and a second glass substrate plate and depositing the frit onto the second glass substrate plate. An organic material, such as those used in the manufacture of an OLED may be deposited on the first substrate plate. An irradiation source (e.g., laser, infrared light) is then used to heat the frit which melts and forms a hermetic seal that connects the first glass substrate plate to the second glass substrate plate and also protects the OLEDs. The frit is an antimony-free glass that includes vanadium, and possibly a CTE lowering filler, such that when the irradiation source irradiates the frit, the frit is heated, softens and forms a bond between the substrate plates while avoiding thermal damage to the OLEDs. Vanadium phosphate frits, for example, have proven especially suitable for sealing glass packages of the type just described, and in particular antimony-containing vanadium phosphate frits. Such frits are stable, exhibit high optical absorbance and have excellent mechanical and aqueous durability. Unfortunately, antimony is a toxic element, and efforts have been directed toward finding a replacement for antimony that does not detrimentally affect the other beneficial attributes of the frit.

To that end, the excellent aqueous durability performance of Sb-vanadium phosphate frits was maintained without $Sb_2O_3$ by replacement of the antimony oxide by a combination of $Fe_2O_3+TiO_2$, along with a small addition of ZnO to maintain flow performance and $B_2O_3$ to reduce the glass transition temperature of the glass. The presence of $Fe_2O_3$ was found to have the greatest effect in improving durability. However, it raised $T_g$, thus degrading frit flow during sealing. In addition, frits with high $Fe_2O_3$ levels (equal to or greater than about 25 mole %) tended to be oxidatively unstable, with repeat samples fired to the same schedule (425° in $N_2$) exhibiting different colors (brown or black), with marked differences in the degree of flow. Although $TiO_2$ alone actually degraded aqueous durability to some extent, the combination of $Fe_2O_3+TiO_2+B_2O_3$ proved to be an ideal combination from the standpoint of obtaining laser-sealable frits with both high aqueous durability and low $T_g$ ($\leq 365°$ C.).

Both lab bench tests exposing the glass to 90° C. deionized water as well as 85° C./85% relative humidity (RH) environmental chamber testing of laser-sealed samples indicate that frits based on the $V_2O_5$—$P_2O_5$—$Fe_2O_3$—$TiO_2$—$ZnO$—$B_2O_3$ system are capable of forming a low Tg frit that provides excellent sealing properties.

The antimony-free glass may contain $V_2O_5$ in any amount in the range from $\geq 40$ mole % to $\leq 52.5$ mole % where the upper and lower limits of suitable ranges fall therein, for example from $\geq 40$ mole % to $\leq 50$ mole %, from $\geq 40$ mole % to $\leq 48$ mole %, from $\geq 42$ mole % to $\leq 50$ mole %, from $\geq 42$ mole % to $\leq 52.5$ mole %, or from $\geq 42$ mole % to $\leq 48$ mole %.

The antimony-free glass may contain $P_2O_5$ in an amount from $\geq 20$ mole % to $<25$ mole %, from $\geq 20$ mole % to $<24$ mole %, from $\geq 20$ mole % to $<23$ mole %, or from $\geq 20$ mole % to $<22.5$ mole %.

The antimony-free glass may contain $Fe_2O_3$ in an amount from $>0$ mole % to $<25$ mole %, from $\geq 10$ mole % to $\leq 20$ mole %, from $\geq 10$ mole % to $\leq 18$ mole %, from $\geq 10$ mole % to $\leq 16$ mole %, from $\geq 10$ mole % to $\leq 15$ mole %, or from $\geq 10$ mole % to $\leq 14$ mole %.

The antimony-free glass may contain $TiO_2$ in an amount from $>0$ mole % to $<25$ mole %, from $\geq 5$ mole % to $\leq 20$ mole %, from $\geq 5$ mole % to $\leq 18$ mole %, from $\geq 5$ mole % to $\leq 15$ mole %, or from $\geq 10$ mole % to $\leq 18$ mole %.

The antimony-free glass may contain $ZnO$ in an amount from $\geq 0$ mole % to $\leq 10$ mole %, from $\geq 2$ mole % to $\leq 5$ mole %, from $\geq 0$ mole % to $\leq 4$ mole %, or from $\geq 2.5$ mole % to $\leq 5$ mole %.

The antimony-free glass may contain $B_2O_3$ in an amount from $>0$ mole % to $\leq 20$ mole %, from $>0$ mole % to $\leq 15$ mole %, from $>0$ mole % to $\leq 10$ mole %, from $>0$ mole % to $\leq 7.5$ mole %, from $\geq 1$ mole % to $\leq 20$ mole %, from $\geq 3$ mole % to $\leq 20$ mole %, or from $\geq 5$ mole % to $\leq 15$ mole %.

$TiO_2+Fe_2O_3$ may be in a range from 15 mole % to 30 mole %, while $TiO_2+Fe_2O_3+B_2O_3$ may be in a range from 25 mole % to 35 mole %, and in some embodiments $TiO_2+Fe_2O_3+B_2O_3$ may be in a range from 27.5 mole % to 35 mole %.

Accordingly, as disclosed herein, an antimony-free glass is described comprising:
$V_2O_5 \geq 40$ mole % and $\leq 52.5$ mole %;
$P_2O_5 \geq 20$ mole % and $<25$ mole %;
$ZnO \geq 0$ mole % and $\leq 10$ mole %;
$Fe_2O_3 >0$ mole % and $<25$ mole %;
$TiO_2 >0$ mole % and $<25$ mole %;
$B_2O_3 >0$ mole % and 20 mole %; and
wherein $TiO_2+Fe_2O_3$ is in a range from 15 mole % to 30 mole %.

The antimony-free glass may, for example, comprise:
$V_2O_5 \geq 40$ mole % and $\leq 52.5$ mole %;
$P_2O_5 \geq 20$ mole % and $<25$ mole %;
$ZnO \geq 0$ mole % and $\leq 5$ mole %;
$Fe_2O_3 \geq 10$ mole % and $<20$ mole %;
$TiO_2 >2$ mole % and $<20$ mole %;
$B_2O_3 \leq 1$ mole % and $\geq 20$ mole %; and
wherein $TiO_2+Fe_2O_3$ is in a range from 15 mole % to 30 mole %.

In some examples, the antimony-free glass may comprise:
$V_2O_5 \geq 40$ mole % and $\leq 50$ mole %;
$P_2O_5 \geq 20$ mole % and $<25$ mole %;
$ZnO \geq 2$ mole % and $<5$ mole %;
$Fe_2O_3 >0$ mole % and $<20$ mole %;
$TiO_2 >0$ mole % and $<20$ mole %;
$B_2O_3 \geq 3$ mole % and $\leq 20$ mole %; and
wherein $TiO_2+Fe_2O_3$ is in a range from 15 mole % to 30 mole %.

In other examples, the antimony-free glass can comprise:
$V_2O_5 \geq 40$ mole % and $\leq 50$ mole %;
$P_2O_5 \geq 20$ mole % and $<25$ mole %;
$ZnO \geq 2$ mole % and $<5$ mole %;
$Fe_2O_3 >0$ mole % and $<25$ mole %;
$TiO_2 >0$ mole % and $<25$ mole %;
$B_2O_3 >5$ mole % and $\leq 20$ mole %; and
wherein $TiO_2+Fe_2O_3$ is in a range from 15 mole % to 30 mole %.

The antimony-free glass may, for example, comprise the following composition:
$V_2O_5$ 40 mole %;
$P_2O_5$ 20 mole %;
$ZnO$ 5 mole %;
$Fe_2O_3 >7.5$ mole % and $<15$ mole %;
$TiO_2 >7.5$ mole % and $<15$ mole %;
$B_2O_3 >5$ mole % and $\leq 20$ mole %; and
wherein $TiO_2+Fe_2O_3$ is $\geq 15$ and $\leq 30$ mole %.

In other examples, the antimony-free glass may comprise the following composition:
$V_2O_5$ 47.5 mole %;
$P_2O_5 \geq 20$ mole % and $<22.5$ mole %;
$ZnO$ 2.5 mole %;
$Fe_2O_3 >12.5$ mole % and $<17$ mole %;
$TiO_2 >2.5$ mole % and $<9.5$ mole %;
$B_2O_3 >1$ mole % and $\leq 15$ mole %; and
wherein $TiO_2+Fe_2O_3$ is $\geq 15$ and $\leq 26.5$ mole %.

The antimony-free glass can have a $T_g \leq 365°$ C., such as a $Tg \leq 350°$ C.

In some embodiments, the antimony-free glass may be a component in a frit for sealing together glass articles, such as glass plates in order to form, for example, a glass package. The frit may further comprise a CTE lowering filler, such as β-eucryptite or β-quartz.

In some embodiments of the antimony-free glass, $TiO_2+Fe_2O_3+B_2O_3$ may be in a range from 25 mole % to 35 mole %.

In some embodiments of the antimony-free glass, $TiO_2+Fe_2O_3+B_2O_3$ may be in a range from 27.5 mole % to 35 mole %.

In another embodiment discloses herein a glass frit is disclosed comprising:
$V_2O_5 \geq 40$ mole % and $\leq 50$ mole %;
$P_2O_5 \geq 20$ mole % and $<25$ mole %;
$ZnO \geq 0$ mole % and $\leq 10$ mole %;
$Fe_2O_3 >0$ mole % and $<25$ mole %;
$TiO_2 >0$ mole % and $<25$ mole %;
$B_2O_3 >0$ mole % and 20 mole %; and
wherein $TiO_2+Fe_2O_3$ is in a range from 15 mole % to 30 mole %.

In certain examples, $TiO_2+Fe_2O_3+B_2O_3$ may be in a range from 25 mole % to 35 mole %.

In some examples, the glass frit further comprises a CTE-lowering filler such as β-eucryptite or β-quartz.

In another aspect, a glass package is described comprising a first glass plate, a second glass plate and a frit that connects the first glass plate to the second glass plate and forms an hermetic seal therebetween, the frit including an antimony-free glass comprising:
$V_2O_5 \geq 40$ mole % and $\leq 50$ mole %;
$P_2O_5 \geq 20$ mole % and $<25$ mole %;
$ZnO \geq 0$ mole % and $\leq 10$ mole %;
$Fe_2O_3 >0$ mole % and $<25$ mole %;

$TiO_2 > 0$ mole % and <25 mole %;
$B_2O_3 > 0$ mole % and 20 mole %; and
wherein $TiO_2 + Fe_2O_3$ is in a range from 15 mole % to 30 mole %.

In some embodiments of the glass package $TiO_2 + Fe_2O_3 + B_2O_3$ may be in a range from 25 mole % to 35 mole %.

In some embodiment of the glass package $TiO_2 + Fe_2O_3 + B_2O_3$ may be in a range from 27.5 mole % to 35 mole %.

The glass package may further comprise an organic material disposed between the first and second glass plates. For example, the glass package may include an organic light emitting device such as an organic light emitting diode.

The invention will be understood more easily and other objects, characteristics, details and advantages thereof will become more clearly apparent in the course of the following explanatory description, which is given, without in any way implying a limitation, with reference to the attached Figures. It is intended that all such additional systems, methods, features and advantages be included within this description, be within the scope of the present invention, and be protected by the accompanying claims.

DETAILED DESCRIPTION

Figure 1:
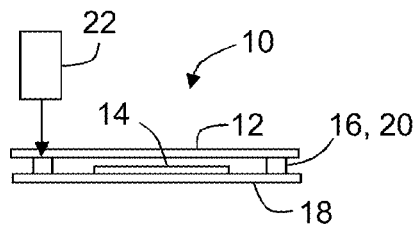
FIG. 1 is a cross sectional illustration of the sealing of an exemplary OLED device using a frit according to embodiments of the present invention.

In the following detailed description, for purposes of explanation and not limitation, example embodiments disclosing specific details are set forth to provide a thorough understanding of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of the present invention. Finally, wherever applicable, like reference numerals refer to like elements.

FIG. 1 depicts a cross-sectional side view illustrating the sealing of the basic components of a hermetically sealed OLED display 10. OLED display 10 includes a multilayer sandwich of a first glass substrate plate 12, one or more OLEDs 14, frit 16 and a second glass substrate plate 18. OLED display 10 comprises hermetic seal 18 formed from frit 16 that protects OLEDs 14 located between the first glass substrate plate 12 and the second glass substrate plate 18. Hermetic seal 20 is typically located around the perimeter of OLED display 10. OLEDs 14 are located within a perimeter of hermetic seal 20. The composition of frit 16, and more particularly the composition of the glass of frit 16, as well as how the hermetic seal 20 is formed from frit 16 is described in greater detail below.

In one embodiment, first and second substrate plates 12 and 18 are transparent glass plates. Frit 16 is deposited along the edges of second glass substrate plate 18. For instance, frit 16 can be placed approximately 1 mm away from the free edges of the second glass substrate plate 18. In the preferred embodiment, frit 16 is a low temperature antimony-free glass frit containing vanadium to enhance the optical absorbance of the frit. Frit 16 may also include a filler material, such as beta eucryptite or beta quartz, that lowers the coefficient of thermal expansion (CTE) of the frit so that it matches or substantially matches the CTEs of the two glass substrate plates 12 and 18.

OLEDs 14 and other circuitry are deposited onto second glass substrate plate 18. The typical OLED 14 includes an anode electrode, one or more organic layers and a cathode electrode. However, it should be readily appreciated that other environmentally sensitive components can be deposited onto second glass substrate plate 18.

Optionally, frit 16 can be pre-sintered to first glass substrate plate 12 prior to sealing glass substrates 12 and 18 together. To accomplish this, first substrate plate 12 comprising frit 16 deposited thereon is heated in a furnace or oven so that it becomes attached to the first glass substrate plate 12.

Next, first and second glass substrate plates 12 and 18 are brought together with frit 16 with one or more OLEDs positioned between them, and frit 16 is irradiated by irradiation source 22 (e.g. a laser or an infrared lamp) so that the frit 16 forms hermetic seal 20 that connects and bonds first substrate plate 12 to second substrate plate 18. Hermetic seal 18 also protects OLEDs 14 by preventing oxygen and moisture in the ambient environment from entering into the OLED display 10.

It should be readily appreciated that the irradiating wavelength should be within the band of high absorption in the particular frit 16. For instance, Ytterbium (900 nm<$\lambda$<1200 nm), Nd:YAG ($\lambda$=1064 nm), Nd:YALO ($\lambda$=1.08 μm), and erbium ($\lambda \approx 1.5$ μm) CW lasers can be used depending on the optical properties of the particular frit 16 and glass substrate plates 12 and 18.

It should also be noted that most traditional low temperature sealing frits are PbO-based, because PbO frits have good flow, and adhesion properties. However, the antimony-free frits disclosed herein not only have a lower CTE than PbO-based frits, but also possess better aqueous durability, as well as being comparable to the traditional Pb-based frits with respect to adhesion.

In addition, although the role played by $P_2O_5$ in a successful sealing frit is important, since it permits stable glasses to be formed, from a laser-sealing and post-seal performance standpoint the effect of $Sb_2O_3$ and $V_2O_5$ should not be ignored. In previous testing, seals made with Sb-free, Zn-based vanadium-phosphate frits could only survive the relatively benign environment of 60° C./40% relative humidity (RH), while seals made from mixed Sb—Zn vanadium phosphate frits survived 60° C./85% RH before failing. Conversely, only seals made with Sb-vanadium-phosphate frits survived 85° C./85% RH exposure. However, despite the role that $Sb_2O_3$ plays in improving aqueous durability, feedback from potential customers consistently raise concerns about its presence. Moreover, $Sb_2O_3$ is thought to impede achieving desirably low glass transition temperatures (Tg). Thus, recent emphasis has been placed on development of a glass suitable for a sealing frit that is more environmentally friendly, noting that antimony is a toxic element.

Work on $Sb_2O_3$-free compositions began by first expressing a basic OLED device sealing frit composition as a three component system (20 mole % $Sb_2O_3$-50 mole % $V_2O_5$-30 mole % $P_2O_5$), simplifying the composition to a two component $Sb_2O_3$-free system (either 50 mole % $V_2O_5$-30 $P_2O_5$, 45 mole % $V_2O_5$-30 mole % $P_2O_5$, or 40 mole % $V_2O_5$-20 mole % $P_2O_5$), and then identifying the remaining components from the standpoint of their effect on aqueous durability, flow, glass transition temperature ($T_g$), and laser-sealability. Both aqueous durability, laser-sealability, and flow of any candidate frit compositions needed to be comparable to the $Sb_2O_3$-containing control sample, while the Tg requirements were relaxed with the criterion that $T_g$ had to be equal to or less than 400° C. (Frits with $T_g$>400° C. are unlikely to flow sufficiently during the presintering step for OLED frits to be handleable in subsequent processing.) The following oxides were investigated as potential substitutes for antimony ($Sb_2O_3$): $WO_3$, $MoO_3$, $TeO_2$, $Bi_2O_3$, $Fe_2O_3$, and $TiO_2$. ZnO was also investigated, although in view of the poor durability results obtained for a $ZnO$—$V_2O_5$—$P_2O_5$ frit, it was considered only as a minor component (5-10 mole %) to lower $T_g$ and maintain flow. The various oxides selected were chosen on the basis that they formed stable binary glasses with $V_2O_5$.

All of the compositions investigated were melted, poured as glass patties, then ball-milled to form fine-particle frits (typically with a $d_{50}$=3-5 μm). A key bench test to screen the different compositions was to prepare and fire flow buttons of the various frits, and then to assess their aqueous durability. The flow buttons were fired in $N_2$ to 400° C.-450° C. (depending upon $T_g$ and crystallization tendency). After firing, the flow buttons were immersed in 90° C. deionized water for 48 hours to assess their aqueous durability. Control samples of the OLED frit (either as the D1 base glass, or as a 70:30 by weight blend of the base glass with a β-eucryptite filler material) were also included in each evaluation. Of the potential replacements for $Sb_2O_3$ that were investigated (see above), only $TiO_2$ and $Fe_2O_3$ appeared promising.

Listed in Tables 1 and 2 are results for a 50 mole % $V_2O_5$-30 mole % $P_2O_5$ composition series with $WO_3$, $MoO_3$, $WO_3$+ZnO, $Bi_2O_3$, and $TeO_2$ as the third component. Also shown are data on the standard OLED base glass, D1, as a comparison standard. All compositions (given in mole %) were evaluated for quality of glass formed from the pour, glass transition temperature ($T_g$) by DSC, flow and sinterability as a 3 μm powder hand-pressed into a pellet ("flow button") and fired at 400° C. for 1 hour in $N_2$, and aqueous durability (as gauged by the color of the supernatant for a fired flow button sample—the darker the color, the less durable the sample) in the bench aqueous durability test described above. Note that none of the potential $Sb_2O_3$ replacements listed in Tables 1 and 2 produced the acceptable level of glass quality, $T_g$, flow, and aqueous durability exhibited by the $Sb_2O_3$-containing control (as judged by the appearance of the supernatant after 48 hrs, 90° C. deionized $H_2O$).

TABLE 1

|  | D1 (control) | D2 | D3 |
| --- | --- | --- | --- |
| Composition (molar basis) | $Sb_2O_3$, 22.9<br>$V_2O_5$, 46.4<br>$P_2O_5$, 26.3<br>$Fe_2O_3$, 2.4<br>$Al_2O_3$, 1.0<br>$TiO_2$, 1.0 | $V_2O_5$, 50<br>$P_2O_5$, 30<br>$WO_3$, 20 | $V_2O_5$, 50<br>$P_2O_5$, 30<br>$MoO_3$, 20 |
| Glass quality at pour | Excellent | Fluid, good quality | Very fluid, good quality |
| $T_g$ | 355° C. | 349° C. | 315° C. |
| Flow (400°-1 hr, $N_2$) | Very good flow and sinterability | Semi-glossy, well-sintered, no flow | Glossy and black with some slump |
| Aqueous durability, appearance of supernatant (48 hrs, 90° C. D.I. $H_2O$) | V. slightly tinted | Black | Black |

TABLE 2

|  | D4 | D5 | D6 |
| --- | --- | --- | --- |
| Composition (molar basis) | $V_2O_5$, 50<br>$P_2O_5$, 30<br>$WO_3$, 10<br>ZnO, 10 | $V_2O_5$, 50<br>$P_2O_5$, 30<br>$Bi_2O_3$, 20 | $V_2O_5$, 50<br>$P_2O_5$, 30<br>$TeO_2$, 20 |
| Glass quality at pour | Good glass, fluid, poured well | Crystallized after pouring | More viscous pour, glass looked good |
| $T_g$ | 323° C. | Not eval. | 329° C. |
| Flow (400° C.-1 hr, $N_2$) | Poor flow | Not eval. | Semi-glossy black, no slump |
| Aqueous durability | Black | Not eval. | Black |

More positive results for $Sb_2O_3$-free vanadium phosphate frits were obtained by $Fe_2O_3$ and/or $TiO_2$ replacement of $Sb_2O_3$ (see Tables 3 and 4). All compositions are expressed in mole %. Several combinations of $Fe_2O_3$+$TiO_2$ produced good glasses at pouring. High $TiO_2$ glasses (i.e., ≥25 mole %) such as D8 had acceptable $T_g$ and flow properties, but also exhibited poor aqueous durabilities. Higher $Fe_2O_3$ glasses (i.e., ≥25 or ≥30 mole %) such as D7 and D11 tended to produce poor glasses at pour, as evidenced by substantial surface devitrification. The relatively poor stability of these glasses (as indicated by the high amount of surface devitrification formed in the patty at pouring) resulted in poor flow as frits. They also tended to be unstable with respect to oxidation state, with a fired flow button from the same lot of powder alternately appearing either black (reduced) or red (oxidized) after the same firing conditions. Also included in Table 4 is D14, a glass with relatively high $Fe_2O_3$ and $TiO_2$ levels, but with 10 mole % ZnO to lower the expected increase in $T_g$ from the $Fe_2O_3$. Note that a second approach to accommodating high $Fe_2O_3$ levels is increasing the $V_2O_5$ content. But as may be seen for D9 and D10, aqueous durability was compromised at higher $V_2O_5$ content.

TABLE 3

|  | D7 | D8 | D9 | D10 |
| --- | --- | --- | --- | --- |
| Composition (molar basis) | $V_2O_5$, 45<br>$P_2O_5$, 30<br>$Fe_2O_3$, 25 | $V_2O_5$, 45<br>$P_2O_5$, 30<br>$TiO_2$, 25 | $V_2O_5$, 50<br>$P_2O_5$, 30<br>$TiO_2$, 15<br>$Fe_2O_3$, 5 | $V_2O_5$, 50<br>$P_2O_5$, 30<br>$TiO_2$, 10<br>$Fe_2O_3$, 10 |
| Glass quality at pour | Substantial surface devit | Poured nicely | Poured nicely | Poured nicely |
| $T_g$ | 353° | 345° | 323° | 322° |

TABLE 3-continued

|  | D7 | D8 | D9 | D10 |
|---|---|---|---|---|
| Flow (400° C., 1 hr, $N_2$) | Poorly sintered | Semi-glossy black, no slump | Sintered, some flow | Sintered, slight flow |
| Aqueous durability, appearance of supernatant (48 hrs, 90° C. D.I. $H_2O$) | Not tested | Black | Med. green | Med. green |

TABLE 4

|  | D11 | D12 | D13 | D14 |
|---|---|---|---|---|
| Composition (molar basis) | $V_2O_5$, 42<br>$P_2O_5$, 28<br>$TiO_2$, 0<br>$Fe_2O_3$, 30 | $V_2O_5$, 40<br>$P_2O_5$, 25<br>$TiO_2$, 17.5<br>$Fe_2O_3$, 17.5 | $V_2O_5$, 45<br>$P_2O_5$, 25<br>$TiO_2$, 0<br>$Fe_2O_3$, 30 | $V_2O_5$, 40<br>$P_2O_5$, 20<br>$TiO_2$, 15<br>$Fe_2O_3$, 15<br>ZnO, 10 |
| Glass quality at pour | Viscous, surface devit | Good glass, no devit | Viscous, surface devit | Good glass, no devit |
| $T_g$ | 371° | 364° | 376° | 360° |
| Flow (400° C., 1 hr, $N_2$) | Poor-powdery and unconsolidated | Poor-powdery | Poor | Semi-glossy black, sintered, no slump |
| Aqueous durability | Not eval. | Not eval. | Not eval. | Lt. brown |

It should also be noted that although the test samples of Tables 3 and 4 having $P_2O_5$ levels equal to or greater than 25 mole % performed poorly, it is anticipated that $P_2O_5$ levels less than 25 mole % can be successfully employed. Table 5 summarizes the results of a second set of $Fe_2O_3$ and $TiO_2$ melts at 10 mole % ZnO. All compositions are expressed in mole %. As for the initial series, some combination of $Fe_2O_3$ and $TiO_2$ is preferred, since $Fe_2O_3$ contributes excellent aqueous durability (but at the cost of high $T_g$ and reduced frit sintering at 400°), and $TiO_2$ results in lower $T_g$ and improved flow (but at the cost of aqueous durability).

TABLE 5

|  | D15 | D16 | D17 | D18 | D19 |
|---|---|---|---|---|---|
| Composition (molar basis) | $V_2O_5$, 50<br>$P_2O_5$, 20<br>ZnO, 10<br>$Fe_2O_3$, 0<br>$TiO_2$, 20 | $V_2O_5$, 50<br>$P_2O_5$, 20<br>ZnO, 10<br>$Fe_2O_3$, 5<br>$TiO_2$, 15 | $V_2O_5$, 50<br>$P_2O_5$, 20<br>ZnO, 10<br>$Fe_2O_3$, 10<br>$TiO_2$, 10 | $V_2O_5$, 50<br>$P_2O_5$, 20<br>ZnO, 10<br>$Fe_2O_3$, 15<br>$TiO_2$, 5 | $V_2O_5$, 50<br>$P_2O_5$, 20<br>ZnO, 10<br>$Fe_2O_3$, 20<br>$TiO_2$, 0 |
| Glass quality at pour | Poured nicely | Poured nicely | Poured nicely | Poured nicely | Poured nicely |
| $T_g$ | 297° | 310° | 322° | 333° | 348° |
| Flow (400°-1 hr, $N_2$) | Well-sintered, good flow | Well-sintered, good flow | Sintered, slight flow | Sintered, some flow | Sintered, little flow |
| Aqueous durability | Dark black | Dark black | Dark black | Clear | Clear |

An additional series of melts were made at higher levels of [$Fe_2O_3+TiO_2$] with ZnO maintained at 5 mole % (see Tables 6 and 7 below). All compositions are expressed in mole %. Note that to accommodate the higher $T_g$ of the high $Fe_2O_3$ glasses, flow was evaluated at 425° C., rather than the 400° C. previously used.

TABLE 6

|  | D20 | D21 | D22 | D23 |
|---|---|---|---|---|
| Composition (molar basis) | $V_2O_5$, 40<br>$P_2O_5$, 20<br>ZnO, 5<br>$Fe_2O_3$, 35<br>$TiO_2$, 0 | $V_2O_5$, 40<br>$P_2O_5$, 20<br>ZnO, 5<br>$Fe_2O_3$, 30<br>$TiO_2$, 5 | $V_2O_5$, 40<br>$P_2O_5$, 20<br>ZnO, 5<br>$Fe_2O_3$, 25<br>$TiO_2$, 10 | $V_2O_5$, 40<br>$P_2O_5$, 20<br>ZnO, 5<br>$Fe_2O_3$, 20<br>$TiO_2$, 15 |
| Glass quality at pour | Substantial surface + bulk devit | Surface devit | Surface devit | Good glass, no devit |
| $T_g$ | 416° | 407° | 400° | 389° |
| Flow (425°-1 hr, $N_2$) | Not sinterable at 425° | Not sinterable at 425° | Not sinterable at 425° | Sintered, no flow |
| Aq. durability | Not tested | Not tested | Not tested | Clear |

TABLE 7

|  | D24 | D25 | D26 | D27 | D28 |
|---|---|---|---|---|---|
| Composition (molar basis) | $V_2O_5$, 40<br>$P_2O_5$, 20<br>ZnO, 5<br>$Fe_2O_3$, 17.5<br>$TiO_2$, 17.5 | $V_2O_5$, 40<br>$P_2O_5$, 20<br>ZnO, 5<br>$Fe_2O_3$, 15<br>$TiO_2$, 20 | $V_2O_5$, 40<br>$P_2O_5$, 20<br>ZnO, 5<br>$Fe_2O_3$, 10<br>$TiO_2$, 25 | $V_2O_5$, 40<br>$P_2O_5$, 20<br>ZnO, 5<br>$Fe_2O_3$, 5<br>$TiO_2$, 30 | $V_2O_5$, 40<br>$P_2O_5$, 20<br>ZnO, 5<br>$Fe_2O_3$, 0<br>$TiO_2$, 35 |
| Glass quality at pour | Good glass, no devit | Good glass, no devit | Good glass, no devit | Good glass, no devit | Good glass, no devit |
| $T_g$ | 3790 | 367° | 351° | 333° | 324° |
| Flow (425°-1 hr, $N_2$) | Sintered, slight flow | Sintered slight flow | Sintered, mod, flow | Sintered, mod. flow | Sintered, good flow |
| Aq. durability | Clear with v. slight tint | Clear | Med. green | Med. green (residue) | Med. green (residue) |

As seen in previous results from Tables 1, 2 and 3, $Fe_2O_3$ levels not much higher than 20 mole % (e.g. about 25 mole %) resulted in frits with high $T_g$, poor stability, and unacceptable flow during 400° C.-425° C. sintering. Similarly, $TiO_2$ not much higher than 20 mole % (e.g. about 25 mole %), resulted in frits with acceptable $T_g$, flow, and stability, but with unacceptable aqueous durability. Frits with $Fe_2O_3$ levels ranging between from about 10 mole % to less than 25 mole %, and with $TiO_2$ levels from about 15 mole % to less than 20 mole % (at 5-10 mole % ZnO) combine excellent aqueous durability with acceptable flow, $T_g$, and glass stability.

Figure 2:
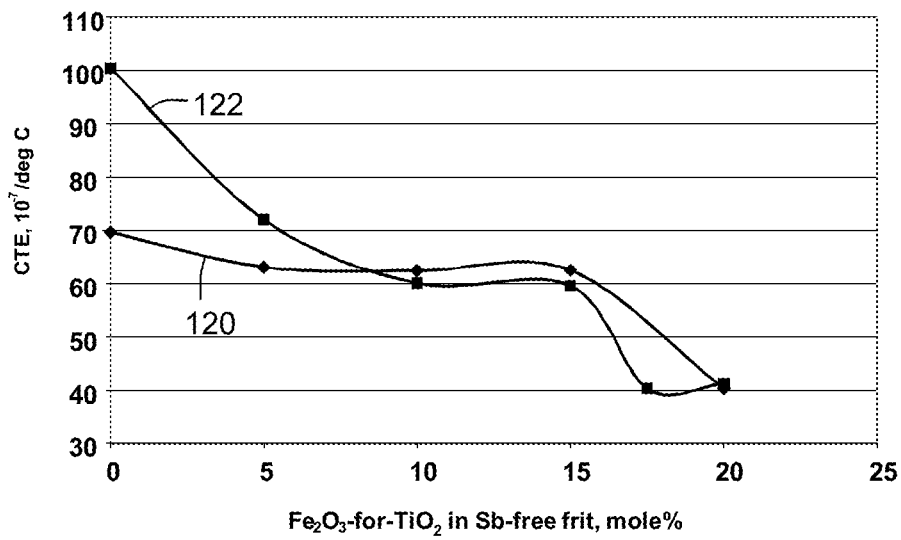
FIG. 2 is a plot of coefficient of thermal expansion (CTE) as a function of the substitution of $Fe_2O_3$ for $TiO_2$ in an Sb-free frit according to embodiments of the present invention in mole % where $Fe_2O_3 + TiO_2$ is between 20 mole % and 35 mole %.

The aqueous durability of the $(Fe_2O_3+TiO_2+ZnO)$ $Sb_2O_3$-free $V_2O_5$—$P_2O_5$ frits were found to be comparable to or slightly superior to the $Sb_2O_3$-containing standard composition. An unexpected result of the $Sb_2O_3$-free work is that the coefficient of thermal expansion (CTE) becomes dramatically lower for the $(Fe_2O_3+TiO_2+ZnO)$ frits at higher $Fe_2O_3$ levels. Shown below in FIG. 2 are CTE data for sintered frits whose composition is listed in Tables 3, 4 and 5. Data are presented for all sinterable frits in the 20 mole % $(Fe_2O_3+TiO_2)$ series of Tables 3, 4, (curve 120) and for the 35 mole % $(Fe_2O_3+TiO_2)$ series of Table 5 as indicated by curve 122. CTE data for sintered frit bars are plotted as a function of $Fe_2O_3$ level in each series up to 20 mole % $Fe_2O_3$, the apparent upper limit to achieving frits with good sinterability and oxidative stability. Note that CTE values are highest at 0 mole % $Fe_2O_3$/maximum $TiO_2$ (20 mole % and 35 mole %, respectively), become essentially constant with increasing $Fe_2O_3$ level at $60$-$65 \times 10^{-7}$/° C., and then decrease substantially at $Fe_2O_3 > 15$ mole % (5 mole % and 20 mole % $TiO_2$, respectively), reaching a value of approximately $40 \times 10^{-7}$/° C. at 17.5-20 mole % $Fe_2O_3$. By comparison, the CTE of the $Sb_2O_3$-containing base frit is approximately $70$-$80 \times 10^{-7}$/° C.

Figure 3:
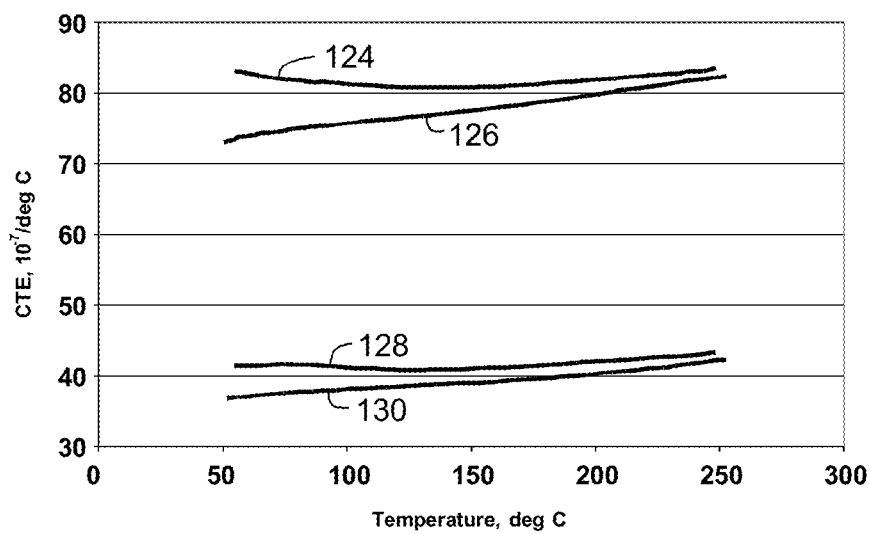
FIG. 3 is a plot comparing CTE as a function of temperature for an Sb-free frit according to embodiments of the present invention and an Sb-containing frit under both heating and cooling conditions.

A more direct comparison of CTE between the $Sb_2O_3$-containing and $Sb_2O_3$-free frits is shown in FIG. 3 where CTE curves are plotted for D1 under both heating and cooling conditions (curves 124 and 126, respectively) and D29 (remelt of D24, Table 7) also under both heating and cooling conditions (curves 128 and 130, respectively). With a CTE value of approximately $40 \times 10^{-7}$/° C. for an unfilled frit, it is possible, with the addition of fillers such as β-eucryptite or beta quartz, to lower the CTE value of this frit close to that of fused silica.

The lab scale aqueous durability results for Sb-free frits were corroborated in a large scale sealing trial involving 85° C./85% RH exposure of laser-sealed samples. Shown in Table 8 are results of the trial and comparison between the standard OLED frit (D1, Table 1; used as a 70:30 blend by weight with low CTE filler (β-eucryptite), and an Sb-free frit (D29, remelt of D24, Table 7; used as an 80:20 wt. blend with low CTE filler (β-quartz). Each frit blend was made into a paste, dispensed on several sheets of EAGLE$^{XG}$ display glass, presintered (Sb-containing standard, heated at 325° C. for 2 hours in air+400° C. for 1 hr in $N_2$; Sb-free, heated at 325° C. for 2 hours in air+425° C. for 1 hour in $N_2$), sealed to sheets of EAGLE$^{XG}$, placed in an 85° C./85% relative humidity (RH) environmental chamber, and then examined periodically for evidence of seal leakage and Ca metal breakdown. In total, there were 3 sheets of the Sb-containing control composition and 7 sheets of the antimony-free composition included in the study, with 9 sealed arrays of Ca metal tabs per sheet. As may be seen in Table 8, several arrays failed either immediately after sealing or within 100 hrs of placing them in a 85° C./85% RH chamber for both the Sb-control and the Sb-free frits; these failures were related, most likely, to gross defects such as contamination present at random for each frit. However, after 96 hrs, no additional failures were observed for either the Sb-control or the Sb-free frit seals.

TABLE 8

| | No. of good cells | | | |
|---|---|---|---|---|
| | Laser-sealed | At start of 85/85 | After 96 hrs of 85/85 | After 1056 hrs of 85/85 |
| Standard Sb-frit blend (70:30, D1: β-eucryptite) | 27 (3 sheets) | 25 | 24 | 24 |
| Sb-free frit blend (80:20, D29: β-quartz) | 63 (7 sheets) | 61 | 57 | 57 |

In summary, the excellent aqueous durability performance of Sb-vanadium phosphate frits was maintained without $Sb_2O_3$ by replacing the antimony oxide with a combination of $Fe_2O_3+TiO_2$, along with a small addition of ZnO to maintain flow and glass transition temperature ($T_g$). The presence of $Fe_2O_3$ was found to have the greatest effect in improving durability. However, in large amounts it raised $T_g$, thus degrading frit flow during sealing. In addition, frits with high $Fe_2O_3$ levels (equal to or greater than about 25 mole %) tended to be oxidatively unstable, with repeat samples fired to the same schedule (425° C. in $N_2$) exhibiting different colors (brown or black), with marked differences in the degree of flow. Although $TiO_2$ actually degraded aqueous durability to some extent when added by itself, the combination of $(Fe_2O_3+TiO_2)$ appeared to be an ideal combination from the standpoint of obtaining laser-sealable frits with both high aqueous durability and low $T_g$ 400° C.).

Both lab bench tests in 90° C. deionized water as well as 85° C./85% RH environmental chamber testing of laser-sealed samples indicate that frits based on the $Fe_2O_3$—$TiO_2$—ZnO—$V_2O_5$—$P_2O_5$ system are capable of forming a hermetic seal after laser-sealing that will withstand high humidity conditions for extended times (≥1000 hrs). An unexpected result of the $(Fe_2O_3+TiO_2)$ replacement of $Sb_2O_3$ was that the CTE of the Sb-free frit without fillers decreased by approximately half (from $70$-$80 \times 10^{-7}$/° C. to $35$-$45 \times 10^{-7}$/° C.), with only a minor increase in $T_g$ (from 355° C. to 370° C.). Frits with CTE values near $40 \times 10^{-7}$/° C. have the potential, with the addition of fillers such as β-eucryptite or β-quartz, of being able to seal fused silica and other low CTE substrates such as Kovar™.

However, in spite of the success in developing the foregoing antimony-free frits, the high $T_g$ (380° C.) resulted in a higher pre-sintering temperature (~425° C.) than comparable antimony-containing frits like D1, and needed to be sustained for a longer period of time at the pre-sintering temperature. Thus, while environmentally friendly, such antimony-free frits tend to increase process times and therefore process costs. Moreover, the antimony-free frits described above were found to crystallize to at least some extent during the pre-sintering cycle, leading to somewhat reduced adhesion properties. Accordingly, additional work was conducted on a lower $T_g$, but still Sb-free, variant. The $T_g$ of this newer frit, D30, was approximately 30° C. lower than D24, and was essentially identical to D1 in $T_g$ and flow. This decreased $T_g$ in D30 was achieved by incorporating about 7.5 mole % more $V_2O_5$ at the expense of ZnO and $TiO_2$, indicating the role that small composition changes have on certain properties of the $V_2O_5$—$P_2O_5$ glasses. Shown in Table 9 is a comparison between D24 and the revised composition D30. All compositional values are in mole %.

TABLE 9

|  | D24 | D30 |
|---|---|---|
| $V_2O_5$ | 40 | 47.5 |
| $P_2O_5$ | 20 | 22.5 |
| ZnO | 5 | 2.5 |
| $TiO_2$ | 17.5 | 10 |
| $Fe_2O_3$ | 17.5 | 17.5 |
| $Al_2O_3$ | 0 | 0 |
| $T_g$ | 378° C. | 351° C. |

A key component in both D24 and D30 is $Fe_2O_3$, which may serve as a redox moderator of $V_2O_5$ (as did $Sb_2O_3$ in D1). $Fe_2O_3$, however, also acts to increase $T_g$. The other components of D24, namely ZnO and $TiO_2$, serve to counteract to some extent the role of $Fe_2O_3$ in raising $T_g$, although they can also tend to lessen resistance to aqueous attack.

Figure 4:
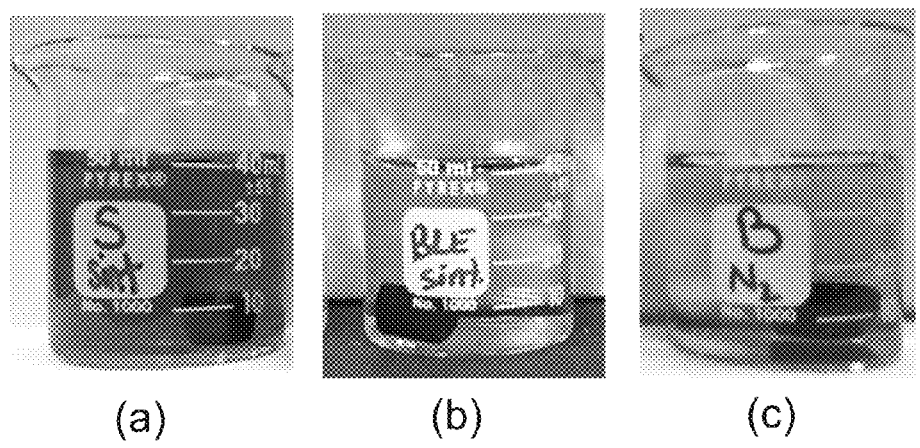
FIG. 4 is a photograph of the supernatant after temperature and humidity exposure of boron-containing antimony-free glasses compared to an antimony-containing glass.

FIG. 4 shows photographs of sintered glass pellets of selected glass compositions suitable for the manufacture of glass frits in laboratory beakers for after being immersed in 90° C. deionized water for 48 hours. Prior to immersion the pellets were heat treated by exposing each flow button to 300° C. for one hour in air followed by 400° C. for one hour in nitrogen. FIG. 4 depicts, in order, from left to right, (a) D1, (b) D24, and (c) D30.

Although the lowering of $T_g$ in Sb-free composition D30 to 350° C. was highly desirable, further composition efforts were undertaken to determine whether additional decreases in $T_g$ were possible. Accordingly, $B_2O_3$, a low $T_g$ glass former, was added. In making the $B_2O_3$ additions, the addition should be done in such as manner as to not degrade glass stability, aqueous durability, and flow. Indeed, the following guidelines were followed: (a) $B_2O_3$ should not be substituted for $P_2O_5$, since, as noted, $P_2O_5$ plays an important role in stabilizing the frit. When $P_2O_5$ is present at moderate levels (approximately 20 mole %), the vanadate glass frit tends to exhibit minimal crystallization, and as a result, the frit exhibits an extended region of viscous flow during the sealing process, leading to improved adhesion; (b) $B_2O_3$ should not be substituted for $V_2O_5$, since, as noted, this component is important for good flow and low CTE; (c) $Fe_2O_3$ should be maintained as close as possible to the level (17.5 mole %) present in the starting D24 and D30 compositions, or durability could be impaired. However, small decreases in $Fe_2O_3$ (down to about 12.5 mole %) can be tolerated with acceptable loss in aqueous durability; and (d) to maintain glass stability, the total amount of glass former (e.g., $V_2O_5+P_2O_5+B_2O_3$) should be at least 60 mole %, with 65-70 mole % more preferred for glass stability. With these prescriptions in mind, $B_2O_3$ was added as follows: $B_2O_3$ for $(ZnO+TiO_2+Fe_2O_3)$, with $Fe_2O_3$ maintained at ≥12.5 mole %). It should be noted that while the following discussion is centered around D1, D24 and D30, this samples are representative of families of compositions. For example, as shown below in Table 10, each of the samples D31-D35 is a glass composition essentially the same as the D24 composition, with the exception that $B_2O_3$ was substituted for $Fe_2O_3$ and $TiO_2$ in varying amounts. The same is true for Table 11, except that the glass is the D30 glass and the variations are D36-D41 (and D40 had decreased $P_2O_5$).

Listed below in Table 10 is the $B_2O_3$ substitution series, including for reference D24. $B_2O_3$ was added in an amount up to 20 mole % following the substitution schema presented above. $T_g$ decreased by approximately 70° C., from a temperature of 376° C. recorded for a remelt of D24 to a low of 305° C. for D34. The onset of crystallization is designated by $T_x$. All compositional values are in mole %.

TABLE 10

|  | D24 | D31 | D32 | D33 | D34 | D35 |
|---|---|---|---|---|---|---|
| $V_2O_5$ | 40 | 40 | 40 | 40 | 40 | 40 |
| $P_2O_5$ | 20 | 20 | 20 | 20 | 20 | 20 |
| $B_2O_3$ | 0 | 5 | 7.5 | 10 | 15 | 20 |
| $Fe_2O_3$ | 17.5 | 15 | 13.7 | 12.5 | 10 | 7.5 |
| $TiO_2$ | 17.5 | 15 | 13.8 | 12.5 | 10 | 7.5 |
| ZnO | 5 | 5 | 5 | 5 | 5 | 5 |
| $T_g$ | 376° C. | 364° C. | 356° C. | 348° C. | 325° C. | 305° C. |
| $T_x$ (onset) | 497° C. | 507° C. | 506° C. | 506° C. | 511° C. | 485° C. |

Additionally, $B_2O_3$ substitutions were also made to D30, using the substitution schema presented earlier. $B_2O_3$ was added in an amount up to 15 mole %. The glass transition temperature $T_g$ for this series decreased by approximately 50° C., from 351° C. to 299° C.

TABLE 11

|  | D30 | D36 | D37 | D38 | D39 | D40 | D41 |
|---|---|---|---|---|---|---|---|
| $V_2O_5$ | 47.5 | 47.5 | 47.5 | 47.5 | 47.5 | 47.5 | 47.5 |
| $P_2O_5$ | 22.5 | 22.5 | 22.5 | 22.5 | 22.5 | 22.5 | 20 |
| $B_2O_3$ | 0 | 1 | 3 | 5 | 7.5 | 10 | 15 |
| $Fe_2O_3$ | 17.5 | 17 | 16 | 15 | 13.5 | 12.5 | 12.5 |
| $TiO_2$ | 10 | 9.5 | 8.5 | 7.5 | 6.5 | 5 | 2.5 |
| ZnO | 2.5 | 2.5 | 2.5 | 2.5 | 2.5 | 2.5 | 2.5 |
| $T_g$ | 351° | 350° | 345° | 331° | 320° | 311° | 299° |
| $T_x$ (onset) | 493° | 476° | 442° | 510° | 512° | 515° | 511° |

Figure 5:
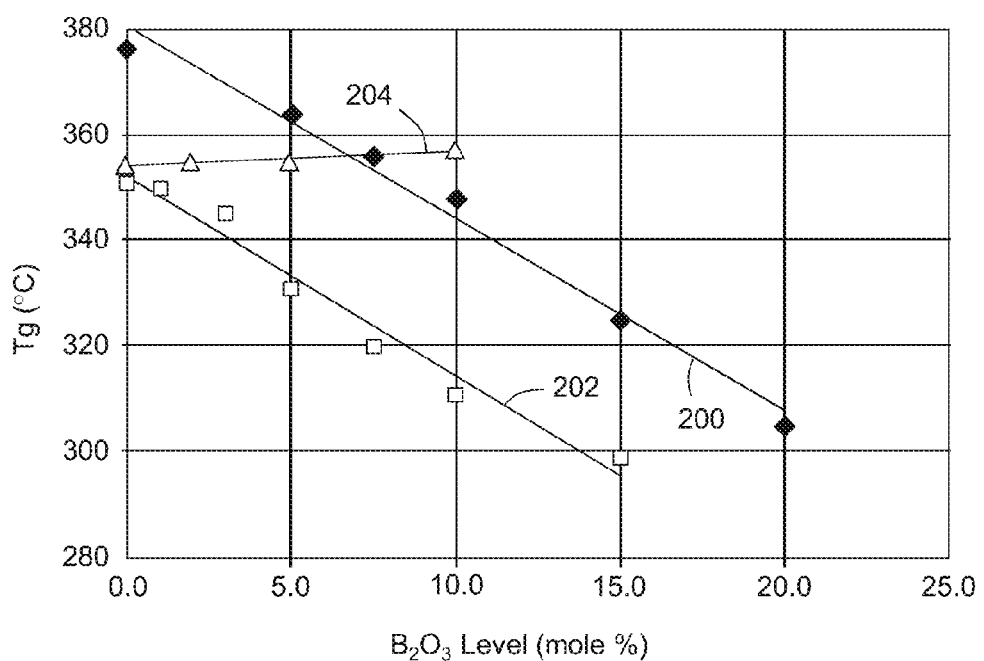
FIG. 5 is a graph of glass transition temperature of both antimony-containing and antimony-free glasses as a function of $B_2O_3$ concentration.

FIG. 5 is a graph illustrating the effect of including boron ($B_2O_3$) in certain frit glasses. For example, curve 200 depicts the effect on $T_g$ for varying amounts of $B_2O_3$ in the general composition for D24, while curve 202 depicts the effect on $T_g$ for varying amounts of $B_2O_3$ in the general composition for D30. Note that the addition of $B_2O_3$ into these glasses resulted in a monotonic, linear decrease in $T_g$, indicating that no abrupt structural changes are occurring in the base vanadium phosphate glass with boron addition over the composition range studied. Equally interesting is the data represented by curve 204, wherein $B_2O_3$ was added to the glass of D1, an antimony-containing glass. Curve 204 illustrates virtually no change in $T_g$, suggesting that the simple addition of boron per se may not result in a significant effect on $T_g$.

Figure 6:
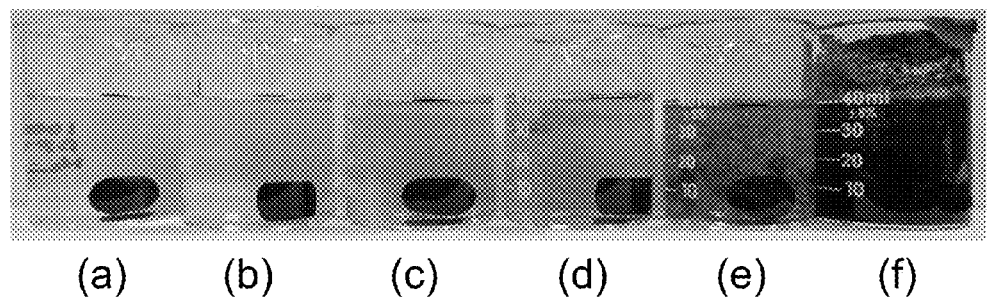
FIGS. 6 and 7 are photographs of the supernatant after temperature and humidity exposure of various compositions of boron-containing antimony-free glasses as disclosed herein.

FIG. 6 shows photographs of sintered glass frit pellets in laboratory beakers for D24 glass, with varying amounts of $B_2O_3$ added, after being immersed in 90° C. deionized water for 48 hours. The pellets were produced by forming a glass melt, grinding the solidified glass to form a glass frit, compressing the frit into pellets and sintering the pellets by exposing each pellet to 300° C. for one hour in air followed by 400° C. for one hour in nitrogen. FIG. 4 depicts, in order, from left to right, (a) 0 mole % $B_2O_3$, (b) 5 mole % $B_2O_3$, (c) 7.5 mole % $B_2O_3$, (d) 10 mole % $B_2O_3$, (e) 15 mole % $B_2O_3$, and (f) 20 mole % $B_2O_3$. Aqueous durability can be judged based on the "darkness" (opacity) of the supernatant: The darker the supernatant, the less durable the glass. The results shown in FIG. 6 indicate acceptable aqueous durability for $B_2O_3$ in amounts up to about 10 mole %. It should be understood, however, that the acceptability of aqueous durability will depend on the end use of the glass.

Figure 7:
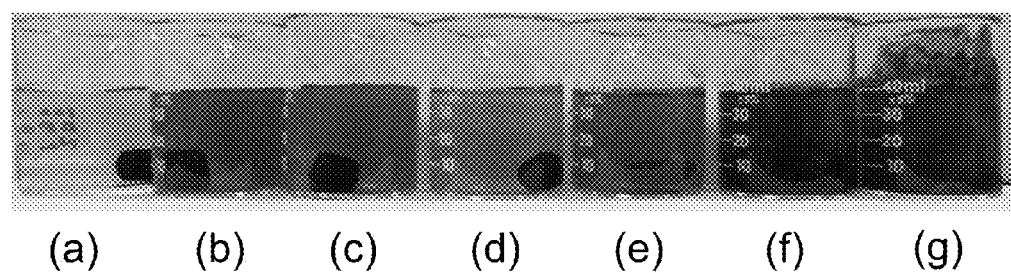

FIG. 7 shows photographs of sintered glass pellets in laboratory beakers for D30 glass, with varying amounts of $B_2O_3$ added, after being immersed in 90° C. deionized water for 48 hours. The pellets were produced as above, by forming a glass melt, grinding the solidified glass to form a glass frit, compressing the frit into pellets and sintering the pellets by exposing each pellet to 300° C. for one hour in air followed by 400° C. for one hour in nitrogen. FIG. 7 depicts, in order, from left to right, (a) 0 mole % $B_2O_3$, (b) 1 mole % $B_2O_3$, (c) 3 mole % $B_2O_3$, (d) 5 mole % $B_2O_3$, (e) 7.5 mole % $B_2O_3$, (f) 10 mole % $B_2O_3$, and 15 mole % $B_2O_3$. As illustrated, aqueous durability in the samples of FIG. 7 are improved over a range from about 5 mole % to about 7.5 mole %, compared with other concentrations shown.

Figure 8:
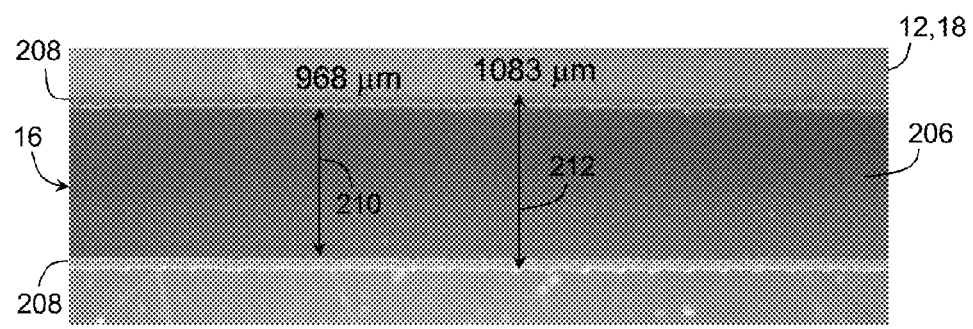
FIG. 8 is a top-down view of a portion of a glass package showing a seal made with a frit comprising a boron-containing antimony-free glass as disclosed herein.

Shown in FIG. 8 is a bright field image of a section of a laser-sealed section of two LOTUS$^{XT}$ display glasses 12, 18 sealed with a frit 16 made with a blend of the 5 mole % $B_2O_3$-modified D30 frit and a CTE-lowering glass-ceramic filler using a method as previously described in the present disclosure. The view in looking downward through glass substrate 12 to glass substrate 18. The frit connecting the glass plates includes a sealed portion 206 and unsealed portions 208. Note that the width 210 of the sealed portion of the frit, i.e. that portion of the frit actually bonded to the glass substrates, is approximately 90% of the total frit width 212 (968 μm/1083 μm=89.38%), indicating excellent flow and sealing behavior for a boron-containing, antimony-free frit as disclosed herein.

Sb-free frits containing boron ($B_2O_3$) are described for sealing electronic devices, such as OLED displays, that offer comparable-to-lower Tg and comparable-to-improved aqueous durability than current Sb-containing frits, such as represented by D1. These same boron-containing Sb-free frits also possess lower Tg and comparable aqueous durability than non-boron-containing but Sb-free frits.

Although embodiments disclosed herein have been illustrated in the accompanying Drawings and described in the foregoing Detailed Description, it should be understood that these embodiments are not limited to those disclosed, but are capable of numerous rearrangements, modifications and substitutions without departing from the spirit of the disclosure as set forth and defined by the following claims.

What is claimed is:

1. A glass article, comprising:
    a glass substrate;
    a frit sealing material attached to the glass substrate, the frit sealing material including an antimony-free glass comprising:
    $V_2O_5 \geq 40$ mole % and $\leq 52.5$ mole %;
    $P_2O_5 \geq 15$ mole % and $<25$ mole %;
    $ZnO \geq 0$ mole % and $\leq 10$ mole %;
    $Fe_2O_3 > 0$ mole % and $<25$ mole %;
    $TiO_2 > 0$ mole % and $<25$ mole %;
    $B_2O_3 > 0$ mole % and $\leq 20$ mole %; and
    wherein $TiO_2 + Fe_2O_3$ is in a range from 15 mole % to 30 mole %, and a $T_g$ of the antimony-free glass is $\leq 365°$ C.

2. The glass article according to claim 1, wherein the antimony-free glass comprises:
    $V_2O_5 \geq 40$ mole % and $\leq 50$ mole %;
    $P_2O_5 \geq 20$ mole % and $<23$ mole %;
    $ZnO \geq 2$ mole % and $\leq 5$ mole %;
    $Fe_2O_3 \geq 10$ mole % and $\leq 20$ mole %;
    $TiO_2 \geq 5$ mole % and $\leq 20$ mole %; and
    $B_2O_3 \geq 1$ mole % and $\leq 20$ mole %.

3. The glass article according to claim 1, wherein the $T_g$ of the antimony-free glass is $\leq 350°$ C.

4. The glass article according to claim 1, wherein a CTE of the sealing material substantially matches a CTE of the glass substrate.

5. The glass article according to claim 1, wherein the frit sealing material comprises a CTE-lowering filler.

6. The glass article according to claim 1, further comprising a second glass substrate, the second glass substrate sealed to the first glass substrate by the frit sealing material.

7. The glass article according to claim 6, wherein the glass article comprises an electronic device.

8. The glass article according to claim 7, wherein the glass article comprises one of a sensor, a photovoltaic device or a display device.

9. The glass article according to claim 8, wherein the glass article is an OLED display device.

* * * * *

UNITED STATES PATENT AND TRADEMARK OFFICE
CERTIFICATE OF CORRECTION

PATENT NO. : 9,878,938 B2
APPLICATION NO. : 15/245578
DATED : January 30, 2018
INVENTOR(S) : Melinda Ann Drake et al.

It is certified that error appears in the above-identified patent and that said Letters Patent is hereby corrected as shown below:

On the Title Page

Page 2, Column 1, item [56], Line 14, delete "Aitken" and insert -- Aitken et al. --, therefor.

Signed and Sealed this
Seventeenth Day of December, 2019

Andrei Iancu
*Director of the United States Patent and Trademark Office*